(12) United States Patent
Shin et al.

(10) Patent No.: US 7,903,187 B2
(45) Date of Patent: Mar. 8, 2011

(54) STATIC ELECTRICITY PREVENTING ASSEMBLY FOR DISPLAY DEVICE AND METHOD OF MANUFACTURING THE SAME

(75) Inventors: Hyun Soo Shin, Yongin-si (KR); Yeon Gon Mo, Yongin-si (KR); Jae Kyeong Jeong, Yongin-si (KR); Se Yeoul Kwon, Yongin-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 872 days.

(21) Appl. No.: 11/635,501

(22) Filed: Dec. 8, 2006

(65) Prior Publication Data
US 2007/0131932 A1 Jun. 14, 2007

(30) Foreign Application Priority Data
Dec. 9, 2005 (KR) ........................ 10-2005-0120897

(51) Int. Cl.
*G02F 1/1333* (2006.01)
*H01L 27/13* (2006.01)
(52) U.S. Cl. ................. 349/40; 257/48; 257/59; 257/72; 257/E27.121; 349/54; 438/17; 438/18; 438/151
(58) Field of Classification Search .................... 349/40, 349/54; 257/48, 59, 72, E27.121; 438/17, 438/18, 151
See application file for complete search history.

(56) References Cited

U.S. PATENT DOCUMENTS

| | | | | |
|---|---|---|---|---|
| 5,068,748 A | * | 11/1991 | Ukai et al. | ....................... 349/40 |
| 5,930,607 A | | 7/1999 | Satou | |
| 6,184,948 B1 | * | 2/2001 | Lee | ................. 349/54 |
| 2005/0200769 A1 | * | 9/2005 | Kim et al. | ....................... 349/40 |

FOREIGN PATENT DOCUMENTS

| | | |
|---|---|---|
| CN | 1 165 568 A | 11/1997 |
| JP | 06-289417 A | 10/1994 |
| JP | 2005-294629 A | 10/2005 |
| JP | 2005294629 A * | 10/2005 |
| KR | 2002-0085204 | 11/2002 |

OTHER PUBLICATIONS

Yoshinaga et al., JP2004-109095 (Machine Translation of JP 2005294629 A).*

* cited by examiner

*Primary Examiner* — Jerome Jackson, Jr.
*Assistant Examiner* — Yu Chen
(74) *Attorney, Agent, or Firm* — Lee & Morse, P.C.

(57) ABSTRACT

A static electricity preventing assembly for an electronic device, may include a substrate, a buffer layer on the substrate, the buffer layer including a plurality of contact holes exposing respective regions of the substrate, a shorting bar on the buffer layer, pad electrodes on the buffer layer, metal wiring lines on the buffer layer, wherein a first portion of each of the metal wiring lines may be electrically connected to the substrate through the contact holes, a second portion of each of the metal wiring lines may be connected to a respective one of the pad electrodes, and a third portion of each of the metal wiring lines may be connected to the shorting bar, wherein the first portion may be between the second portion and the third portion.

18 Claims, 3 Drawing Sheets

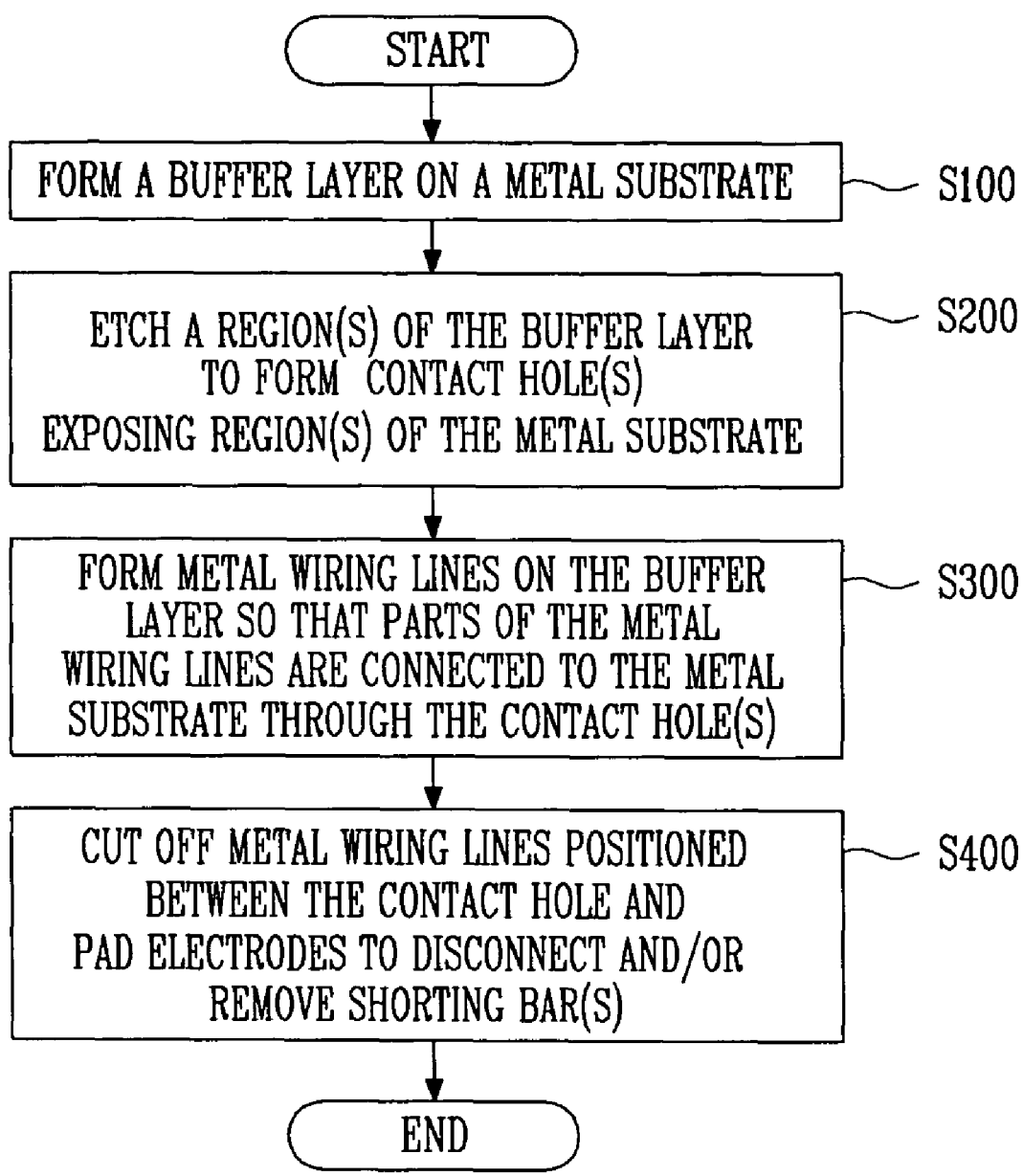

STATIC ELECTRICITY PREVENTING ASSEMBLY FOR DISPLAY DEVICE AND METHOD OF MANUFACTURING THE SAME

BACKGROUND OF THE INVENTION

1. Field of the Invention

The invention relates to a static electricity preventing assembly and a method of manufacturing a static electricity preventing assembly, employable by, e.g., a display device. More particularly, the invention relates to a static electricity preventing assembly, and a method of manufacturing a static electricity preventing assembly, for a display device in which metal wiring lines and a metal substrate may be electrically connected to each other.

2. Discussion of the Related Art

Display devices may include, e.g., thin film transistor (TFT) devices. Such TFT devices may be damaged by static electricity during and/or after processing. Static electricity may be generated when, e.g., external opposite charges are instantaneously applied, thereby causing discharge that results in high current flow. Static electricity may damage a gate insulating layer of a TFT device, thereby deteriorating the TFT device. To help reduce and/or prevent such discharge from being electrified into static electricity, the charges in the metal wiring lines may be commonly extinguished.

A conventional static electricity preventing assembly may include a first shorting bar electrically connected to a plurality of scan lines, and a second shorting bar. The first shorting bar may enable the plurality of scan lines to have a same voltage, and the second shorting bar may enable the plurality of data lines to have a same voltage so as to help prevent charges from being concentrated in one or more areas. In conventional static electricity preventing assemblies, an effectiveness of the static preventing assembly depends on an area of the shorting bar(s) serving as the primary charge dissipation structure for charges generated in the metal wiring lines.

More particularly, when a large amount of charges are generated, the plurality of scan lines and/or the plurality of data lines may not have the same voltage and charges may be concentrated on one or more areas. When charges concentrate in one or more areas, external opposite charges may be attracted to the areas of concentrated charges, thereby generating discharge that may damage the device.

SUMMARY OF THE INVENTION

The invention is therefore directed to a static electricity preventing assembly and a method of forming a static electricity preventing assembly, which substantially overcome one or more of the problems due to the limitations and disadvantages of the related art.

It is therefore a feature of embodiments of the invention to provide a static electricity preventing assembly for a display, e.g., an organic light emitting display (OLED), in which charges electrified in metal wiring lines are discharged to a metal substrate.

At least one of the above and other features and advantages of the invention may be realized by providing a static electricity preventing assembly for a display device including a substrate, a buffer layer on the substrate, the buffer layer including a plurality of contact holes exposing respective regions of the substrate, a shorting bar on the buffer layer, pad electrodes on the buffer layer, metal wiring lines on the buffer layer, wherein a first portion of each of the metal wiring lines may be electrically connected to the substrate through the contact holes, a second portion of each of the metal wiring lines may be connected to a respective one of the pad electrodes, and a third portion of each of the metal wiring lines may be connected to the shorting bar, wherein the first portion may be between the second portion and the third portion.

The substrate may be a metal substrate. The assembly may include a second shorting bar, wherein some of the metal wiring lines may be connected to the substrate and the shorting bar, and some others of the metal wiring lines may be connected to the substrate and the second shorting bar. The electronic device may be a display device. The display device may be an organic light emitting type display device.

At least one of the above and other features and advantages of the invention may be separately realized by providing a static electricity preventing assembly for a display device including a substrate and a pixel unit including a plurality of pixels formed at intersections between a plurality of scan lines and a plurality of data lines, a plurality of first pad electrodes connected to the plurality of scan lines and a plurality of second pad electrodes connected to the plurality of data lines, the static electricity preventing assembly including a first group of wiring lines, a portion of each of the first group of wiring lines being directly connected to the substrate, a second group of wiring lines, a portion of each of the second group of wiring lines being directly connected to the substrate, a first shorting bar connected to the plurality of first pad electrodes by the first group of wiring lines, and a second shorting bar connected to the plurality of second pad electrodes by the second group of wiring lines.

The respective portions of the first group of wiring lines connected to the substrate may be between the first shorting bar and the first pad electrodes. The respective portions of the second group of wiring lines connected to the substrate may be between the second shorting bar and the second pad electrodes. The substrate may be a metal substrate. The first group of wiring lines and the second group of wiring lines may be metal wiring lines. The assembly may include a buffer layer between the substrate and the first pad electrodes, the second pad electrodes and the first and second groups of wiring lines. The first and second groups of wiring lines may be directly connected to the substrate by holes in the buffer layer.

At least one of the above features and advantages of the invention may be separately realized by providing a method of manufacturing a static electricity preventing assembly employable by an electronic device including a plurality of pad electrodes, the method including forming a buffer layer on a substrate, etching portions of the buffer layer to form a plurality of holes in the buffer layer; the holes exposing respective portions of the substrate, forming wiring lines on the buffer layer including the plurality of holes, wherein the wiring lines may be connected to the substrate by the plurality of holes and being connected to the respective ones of the plurality of pad electrodes.

Forming the buffer layer may include forming the buffer layer on a metal substrate. Forming the wiring lines may include forming metal wiring lines on the buffer layer. Forming the wiring lines may include forming wiring lines on the buffer layer such that the wiring lines may be connected to the substrate by the plurality of holes and may be connected to the respective ones of the plurality of pad electrodes and a shorting bar provided on the buffer layer. The method may include removing a portion of each of the wiring lines to disconnect the shorting bar from the pad electrodes. Removing the portion of each of the wiring lines may include removing a portion of each the wiring lines between the pad electrodes and the plurality of holes so as to disconnect each of the wiring lines from the substrate and the shorting bar. The electronic device may be a display device. The display device may be an organic light emitting type display device.

BRIEF DESCRIPTION OF THE DRAWINGS

The above and other features and advantages of the invention will become more apparent to those of ordinary skill in the art by describing in detail exemplary embodiments thereof with reference to the attached drawings in which:

FIG. 3 illustrates a flow chart of an exemplary method of manufacturing a static electricity preventing assembly according to the invention.

DETAILED DESCRIPTION OF THE INVENTION

Figure 1:
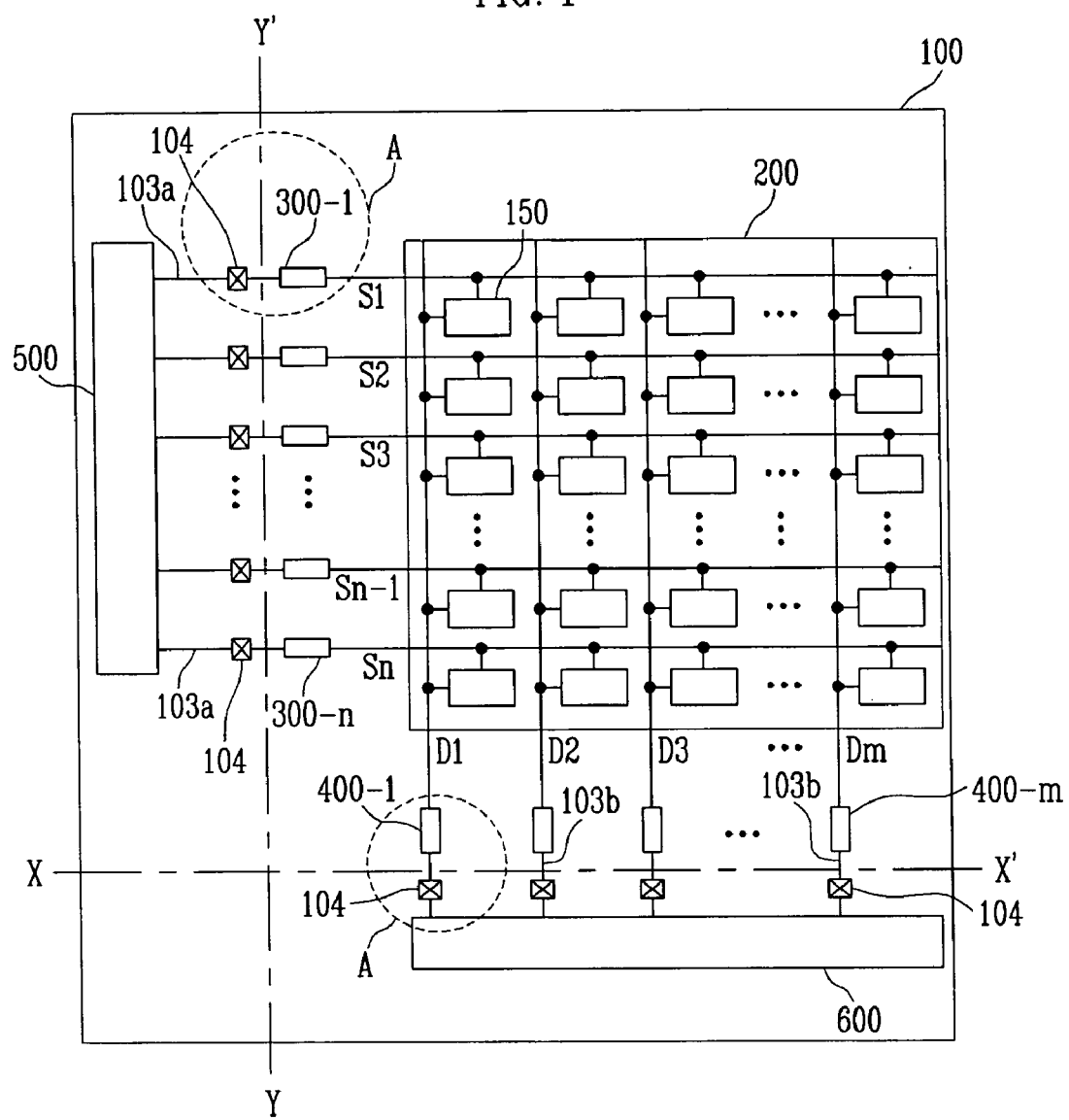
FIG. 1 illustrates an exemplary embodiment of a static electricity preventing assembly according to the invention, which is implemented in an exemplary OLED.

Korean Patent Application No. 10-2005-0120897, filed on Dec. 9, 2005, in the Korean Intellectual Property Office, and entitled: "Static Electricity Preventing Structure for Organic Light Emitting Display and Method of Manufacturing the Same," is incorporated by reference herein in its entirety.

The invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates an exemplary embodiment of a static electricity preventing assembly employing one or more aspects of the invention, which is implemented in an organic light emitting display (OLED), as an exemplary electronic device employing the static electricity preventing assembly.

Figure 2:
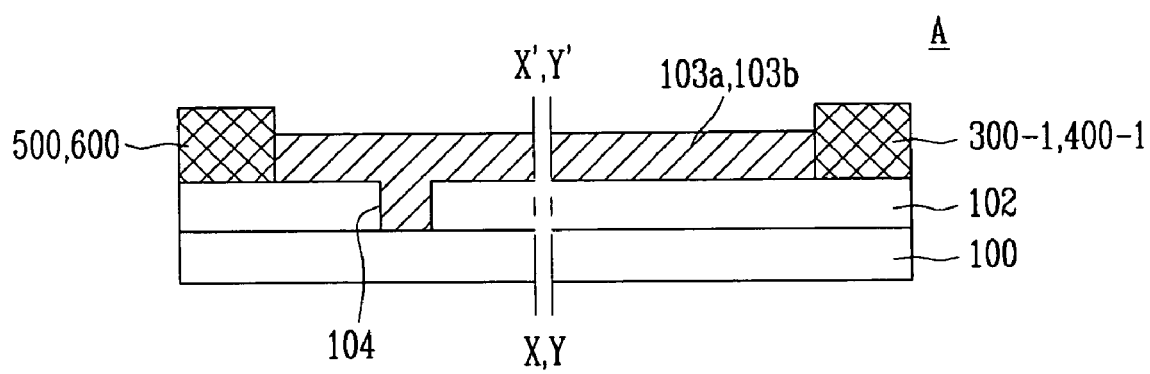
FIG. 2 illustrates an enlarged cross-sectional view of part A of FIG. 1.

Referring to FIG. 1, an OLED, as an exemplary electronic device, may include a pixel unit 200 including a plurality of scan lines S1 to Sn and a plurality of data lines D1 to Dm that intersect each other and define a plurality of pixels 150 at intersections thereof, first pad electrodes 300-1 to 300-n, and second pad electrodes 400-1 to 400-m. The OLED may be arranged on a substrate, e.g., a metal substrate 100, and, as illustrated in FIG. 2, a buffer layer 102 may be formed between the first and second pad electrodes 300-1 to 300-n, 400-1 to 400-m and the metal substrate 100.

The first pad electrodes 300-1 to 300-n may be connected to and may supply scan signals to the plurality of scan lines S1 to Sn. Each of the n first pad electrodes 300-1 to 300-n may be respectively associated with one of the plurality of scan lines S1 to Sn.

The second pad electrodes 400-1 to 400-m may be connected to and may supply driving signals to the plurality of data lines D1 to Dm. Each of the m second pad electrodes 400-1 to 400-m may be respectively associated with one of the plurality of data lines D1 to Dm.

A static electricity preventing assembly employable by such an exemplary electronic device, e.g., OLED, may include one or more shorting bars 500, 600, one or more groups of metal wiring lines 103a, 103b and a plurality of contact holes 104 formed in the buffer layer 102. The contact holes 104 in the buffer layer 102 may enable the plurality of metal wiring lines 103a, 103b to be connected to the metal substrate 100. That is, e.g., the metal wiring lines 103 may be directly connected to the metal substrate 100 via the contact holes 104. The first group of the metal wiring lines 103a may be connected between the first shorting bar 500 and the respective first pad electrodes 300-1 to 300-n. The second group of metal wiring lines 103b may be connected between the second shorting bar 600 and the respective second pad electrodes 400-1 to 400-m.

As illustrated in FIG. 1, the first and second groups of metal wiring lines 103a, 103b may extend from the first and second pad electrodes 300-1 to 300-n, 400-1 to 400-m such that if the metal wiring lines 103a, 103b are electrically connected, either directly or indirectly, to the metal substrate 100, the plurality of scan lines S1 to Sn and the plurality of data lines D1 to Dm may also be electrically connected to the metal substrate 100. Thus, charges electrified in the plurality of scan lines S1 to Sn and the plurality of data lines D1 to Dm may be absorbed in the metal substrate 100 via the contact holes 104.

Embodiments of the invention may include the first shorting bar 500 and the second shorting bar 600. The first shorting bar 500 may be connected to the first pad electrodes 300-1 to 300-n by the first group of metal wiring lines 103a. Thus, the first shorting bar 500 may enable the first group of metal wiring lines 103 to have a same voltage and to extinguish charges electrified in, e.g., the scan lines S1 to Sn.

The second shorting bar 600 may be connected to the plurality of second pad electrodes 400-1 to 400-m by the metal wiring lines 103. Thus, the second shorting bar 600 may enable the second group of metal wiring lines 103b to have a same voltage and to extinguish charges electrified in, e.g., the data lines D1 to Dm.

In embodiments of the invention, one, some or all of the metal wiring lines 103a, 103b may be directly connected to the metal substrate 100 via respective contact holes 104. That is, in embodiments of the invention all of the metal wiring lines 103a, 103b may be electrically connected to the metal substrate 100, but only some of the metal wiring lines 103a, 103b may be directly connected to the metal substrate 100 via, e.g., contact holes 104. In other embodiments of the invention, each of the metal wiring lines 103a, 103b may be directly connected to the metal substrate 100 via, e.g., contact holes 104.

In embodiments of the invention, the contact holes 104 may be provided at portions of the metal wiring lines 103a, 103b between the pixel unit 200 and the respective first or second shorting bar 500, 600. More particularly, e.g., as illustrated in FIG. 1, the contact holes 104 may be provided at portions of the metal wiring lines 103a, 103b between the respective first and/or second pad electrodes 300-1 to 300-n, 400-1 to 400-m and/or the first and/or second shorting bars 500, 600.

After, e.g., processing and/or testing of the electronic device employing the static electricity preventing assembly, the first shorting bar 500 and/or the second shorting bar 600 may be disconnected from first and second pad electrodes 300-1 to 300-n, 400-1 to 400-m, or may be removed. The first shorting bar 500 and/or the second shorting bar 600 may be disconnected by, e.g., cutting off portions of the metal wiring lines 103a, 103b. That is, the metal wiring lines 103a, 103b may be disconnected from each other after processing and/or testing of the electronic device employing the static electricity preventing assembly.

For example, to disconnect the metal wiring lines 103a, 103b from each other, respective portions of the metal wiring lines 103 between the respective first and/or second pad electrodes 300-1 to 300-n, 400-1 to 400-m and the first and/or second shorting bars 500, 600 may be removed. More particularly, respective portions of the metal wiring lines 103a, 103b between the respective first and/or second pad electrodes 300-1 to 300-n, 400-1 to 400-m and the respective contact holes 104 may be removed. For example, referring to FIG. 1, portions along line Y-Y' of FIG. 1 may be removed from the first group of metal wiring lines 103a and portions along line X-X' of FIG. 1 may be removed form the second group of metal wiring lines 103b.

FIG. 2 illustrates an enlarged cross-sectional view of parts A of FIG. 1, along a direction of extension of the respective metal lines 103a, 103b. More particularly, FIG. 2 illustrates a cross-sectional view that may correspond to the first group of metal wiring lines 103a between the first pad electrode 300-1 and the first shorting bar 500, or the second group of metal wiring lines 103b extending between the second shorting bar 600 and the second pad electrode 400-1.

As illustrated in FIG. 2, the metal wiring lines 103a, 103b may respectively connect the first and second shorting bars 500, 600 to the respective first and second pad electrodes 300-1, 400-1, and may connect the shoring bars 500, 600 and first and second pad electrodes 300-1, 400-1 to the metal substrate 100.

The buffer layer 102 may be formed on the metal substrate 100 to protect the metal substrate 100. For example, the buffer layer 102 may help prevent the metal substrate 100 from being damaged by environmental factors, e.g., external heat. As discussed above, contact holes 104 may be formed in buffer layer 102, and the contact holes 104 may expose respective portions of a region of the metal substrate 100.

The metal wiring line(s) 103a, 103b may be formed on the buffer layer 102 and may be electrically connected to the metal substrate 100 through the contact hole 104. Charges electrified in each of the metal wiring line(s) 103a, 103b may be absorbed by the metal substrate 100.

In embodiments of the invention, the respective pad electrode, e.g., 300-1 to 300-n, 400-1 to 400-m, may be formed on one end portion of the metal wiring line 103a, 103b, and the respective shorting bar, e.g., 500, 600, may be formed at another end portion of the metal wiring line 103a, 103b. The first end portion and the second end portion may be substantially opposite to each other, such that the respective contact hole 104 may be arranged between the respective pad electrode 300-1 to 300-n, 400-1 to 400-m and the respective shorting bar 500, 600.

FIG. 3 illustrates a flow chart of an exemplary method of manufacturing a static electricity preventing assembly for an electronic device, e.g., an OLED, according to the invention. The exemplary process will be described with reference to the exemplary embodiment of the static electricity preventing assembly described above with reference to FIGS. 1 and 2. However, methods implementing one or more aspects of the invention may be employed to manufacture other embodiments of a static electricity preventing assembly according to one or more aspects of the invention.

Referring to FIG. 3, the exemplary process of manufacturing the static electricity preventing assembly according to the invention may include steps S100 to S400. The process may begin with the buffer layer 102 being formed on the metal substrate 100. The buffer layer 102 may be formed to protect and/or prevent the metal substrate from being damaged by environmental factors, e.g., heat. Next, in step S200, respective portion(s) of the buffer layer 102 may be removed, e.g., etched, to form the contact hole(s) 104. The contact hole(s) 104 may expose respective portion(s) of the metal substrate 100.

The process may proceed to step S300, during which the metal wiring line(s) 103a, 103b may be formed on the buffer layer 102. As a result of the contact hole(s) 104 that may have been formed during, e.g., step S200, one, some or all of the metal wiring lines 103a, 103b may be directly connected to the metal substrate 100. As a result, charges electrified in the respective metal wiring lines 103a, 103b may be absorbed by the metal substrate 100.

The process may then proceed to step S400, during which portion(s) of the metal wiring lines 103a, 103b may be cut to disconnect the shorting bars 500, 600 and/or to disconnect the metal wiring lines 103a, 103b from each other. More particularly, e.g., portion(s) of the metal wiring lines 103a, 103b extending between respective ones of the contact hole 104 and the pad electrodes 300-1 to 300-n and/or 400-1 to 400-m may be cut off to disconnect the respective shorting bar(s) 500, 600. In embodiments of the invention, the shorting bar(s) 500, 600 may be completely removed after processing and/or testing. The metal wiring lines 103a, 103b may be completely disconnected from each other, the metal substrate 100, the shorting bars 500, 600 and/or the pad electrodes 300-1 to 300-n, 400-1 to 400-m to prevent an electrical short between the metal substrate 100 and the metal wiring lines 103a, 103b.

Embodiments of the invention employ, e.g., the metal substrate of a display device as a charge absorbing layer, thereby providing a larger, wider area for charge dissipation so as to reduce and/or prevent charge concentration and damage from static electricity. More particularly, e.g., charges electrified in metal wiring lines may be dissipated to the metal substrate. Embodiments of the invention enable damage from static electricity, at least during processing and/or testing of an electronic device, e.g., OLED, employing such a static electricity preventing assembly, to be reduced and/or prevented.

Exemplary embodiments of the invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A static electricity preventing assembly for an electronic device, comprising:
   a substrate;
   a buffer layer on the substrate, the buffer layer including a plurality of contact holes exposing respective regions of the substrate;
   a first shorting bar on the buffer layer;
   a second shorting bar on the buffer layer, the second shorting bar being separate from the first shorting bar, the second shorting bar extending along a same plane as the first shorting bar;
   a first group of pad electrodes on the buffer layer;
   a second group of pad electrodes on the buffer layer;
   a first group of metal wiring lines on the buffer layer; and
   a second group of metal wiring lines on the buffer layer, wherein:

a first portion of each of the first group of metal wiring lines is electrically connected to the substrate through respective ones of the contact holes, a second portion of each of the first group of metal wiring lines is connected to a respective one of the first group of pad electrodes, and a third portion of each of the first group of metal wiring lines is connected to the first shorting bar, the first portion of each of the first group of metal wiring lines being between the second portion and the third portion, and a first portion of each of the second group of metal wiring lines is electrically connected to the substrate through respective ones of the contact holes, a second portion of each of the second group of metal wiring lines is connected to a respective one of the second group of pad electrodes, and a third portion of each of the second group of metal wiring lines is connected to the second shorting bar, the first portion of each of the second group of metal wiring lines being between the second portion and the third portion.

2. The static electricity preventing assembly as claimed in claim 1, wherein the substrate is a metal substrate.

3. The static electricity preventing assembly as claimed in claim 1, wherein the electronic device is a display device.

4. The static electricity preventing assembly as claimed in claim 3, wherein the display device is an organic light emitting type display device.

5. The static electricity preventing assembly as claimed in claim 1, wherein the first group of metal wiring lines extend along a first direction, the second group of metal wiring lines extend along a second direction, the first shorting bar extends along the second direction, and the second shorting bar extends along the first direction, the first direction crossing the second direction.

6. A static electricity preventing assembly for a display device including a metal substrate and a pixel unit including a plurality of pixels formed at intersections between a plurality of scan lines and a plurality of data lines, a plurality of first pad electrodes connected to the plurality of scan lines and a plurality of second pad electrodes connected to the plurality of data lines, the static electricity preventing assembly comprising:

a first group of wiring lines, a portion of each of the first group of wiring lines being directly connected to the metal substrate;

a second group of wiring lines, a portion of each of the second group of wiring lines being directly connected to the metal substrate;

a first shorting bar connected to the plurality of first pad electrodes by the first group of wiring lines; and a second shorting bar connected to the plurality of second pad electrodes by the second group of wiring lines wherein the first group of wiring lines, the second group of wiring lines, the first shorting bar, and the second shorting bar extend along a same plane.

7. The static electricity preventing assembly as claimed in claim 6, wherein the respective portions of the first group of wiring lines connected to the metal substrate are between the first shorting bar and the first pad electrodes.

8. The static electricity preventing assembly as claimed in claim 6, wherein the respective portions of the second group of wiring lines connected to the metal substrate are between the second shorting bar and the second pad electrodes.

9. The static electricity preventing assembly as claimed in claim 6, wherein the first group of wiring lines and the second group of wiring lines are metal wiring lines.

10. The static electricity preventing assembly as claimed in claim 6, further comprising a buffer layer between the metal substrate and the first pad electrodes, the second pad electrodes and the first and second groups of wiring lines.

11. The static electricity preventing assembly as claimed in claim 10, wherein the first and second groups of wiring lines are directly connected to the metal substrate by holes in the buffer layer.

12. The static electricity preventing assembly as claimed in claim 6, wherein the first shorting bar is arranged spaced apart from the second shorting bar.

13. A method of manufacturing a static electricity preventing assembly employable by an electronic device including a plurality of pad electrodes, the method comprising:

forming a buffer layer on a substrate;

etching portions of the buffer layer to form a plurality of holes in the buffer layer, the holes exposing respective portions of the substrate;

forming a first group and a second group of pad electrodes on the buffer layer including the plurality of holes;

forming a first group and a second group of metal wiring lines on the buffer layer including the plurality of holes; and forming a first shorting bar and a second shorting bar on a same plane over the buffer layer, the second shorting bar being separate from the first shorting bar, wherein:

a first portion of each of the first group of metal wiring lines is electrically connected to the substrate through respective ones of the etched portions of the buffer layer, a second portion of each of the first group of metal wiring lines is connected to a respective one of the first group of pad electrodes, and a third portion of each of the first group of metal wiring lines is connected to the first shorting bar, the first portion of each of the first group of metal wiring lines being between the second portion and the third portion, and a first portion of each of the second group of metal wiring lines is electrically connected to the substrate through respective ones of the etched portions of the buffer layer, a second portion of each of the second group of metal wiring lines is connected to a respective one of the second group of pad electrodes, and a third portion of each of the second group of metal wiring lines is connected to the second shorting bar, the first portion of each of the second group of metal wiring lines being between the second portion and the third portion.

14. The method as claimed in claim 13, wherein forming the buffer layer comprises forming the buffer layer on a metal substrate.

15. The method as claimed in claim 13, further comprising removing a portion of each of the first group of wiring lines and the second group of wiring lines to disconnect the first shorting bar and the second shorting bar from the first group of pad electrodes and the second group of pad electrodes, respectively.

16. The method as claimed in claim 15, wherein removing the portion of each of the first group of wiring lines and the second group wiring lines comprises removing a portion of each the first group of wiring lines and the second group of wiring lines between the first group and the second group of pad electrodes and the plurality of etched portions of the buffer so as to disconnect each of the first group of wiring lines and the second group of wiring lines from the substrate and the first shorting bar and the second shorting bar, respectively.

17. The method as claimed in claim 13, wherein the electronic device is a display device.

18. The method as claimed in claim 17, wherein the display device is an organic light emitting type display device.

* * * * *